United States Patent [19]

Sjöberg et al.

[11] Patent Number: 5,907,823
[45] Date of Patent: *May 25, 1999

[54] METHOD AND CIRCUIT ARRANGEMENT FOR ADJUSTING THE LEVEL OR DYNAMIC RANGE OF AN AUDIO SIGNAL

[75] Inventors: Jari Sjöberg; Janne Kivinen; Ari Koski; Mauri Väänänen, all of Tampere, Finland

[73] Assignee: Nokia Mobile Phones Ltd., Salo, Finland

[*] Notice: This patent issued on a continued prosecution application filed under 37 CFR 1.53(d), and is subject to the twenty year patent term provisions of 35 U.S.C. 154(a)(2).

[21] Appl. No.: 08/710,014

[22] Filed: Sep. 11, 1996

[30] Foreign Application Priority Data

Sep. 13, 1995 [FI] Finland ..................................... 954295

[51] Int. Cl.$^6$ ................. G10L 3/02; H03G 3/32
[52] U.S. Cl. .................. 704/225; 704/227; 455/246.1
[58] Field of Search ...................... 381/94, 110; 379/406, 379/410, 411; 704/225, 215, 228, 233

[56] References Cited

U.S. PATENT DOCUMENTS

| | | |
|---|---|---|
| 4,628,526 | 12/1986 | Germer ..................................... 381/57 |
| 5,036,540 | 7/1991 | Eastmond ................................ 704/226 |
| 5,235,637 | 8/1993 | Kraz et al. ............................... 379/387 |
| 5,285,165 | 2/1994 | Renfors et al. ......................... 327/552 |
| 5,297,198 | 3/1994 | Butani et al. ........................... 379/389 |
| 5,406,635 | 4/1995 | Jarvinen ................................. 381/94.3 |

FOREIGN PATENT DOCUMENTS

| | | |
|---|---|---|
| 0 452 734 A2 | 10/1991 | European Pat. Off. . |
| 0 600 164 A1 | 6/1994 | European Pat. Off. . |
| 0 633 658 A3 | 1/1995 | European Pat. Off. . |
| 0 642 290 A2 | 3/1995 | European Pat. Off. . |
| 38 05 357 A1 | 8/1989 | Germany . |
| WO94/07305 | 3/1994 | WIPO . |

*Primary Examiner*—David R. Hudspeth
*Assistant Examiner*—Tálivaldis Ivars Smits
*Attorney, Agent, or Firm*—Perman & Green, LLP

[57] ABSTRACT

The invention relates to a method and a circuit arrangement for adjusting the level and/or dynamic range of an audio signal in a transmission system and particularly in a mobile station. According to the invention, the level of acoustic noise in the environment of a terminal (10, 12) and the level and noise level of a received signal are measured (123) and the level and/or dynamic range of the reproduced signal are adjusted (121, 122) according to the results from said measurements. The solution according to the invention helps reduce the effect of noise in the signal transmitted on the transmission channel (11) and of the acoustic noise in the environment of the terminal (12) on the intelligibility of the reproduced information.

34 Claims, 5 Drawing Sheets

METHOD AND CIRCUIT ARRANGEMENT FOR ADJUSTING THE LEVEL OR DYNAMIC RANGE OF AN AUDIO SIGNAL

BACKGROUND OF THE INVENTION

1. Field of the Invention

The invention relates to a method and a circuit arrangement for adjusting the level and dynamic range of an audio signal in a transmission system and particularly in a mobile station.

2. Description of the Prior Art

There are several factors related to mobile telephone systems that deteriorate the quality of a speech signal transmitted via a transmission path. A received audio signal consists of a "payload" signal, such as speech, and noise. The latter may be electrical noise from a transmitter or transmission channel, interfering signals connected to the transmission channel from external sources or it may be caused by acoustic noise in the information source environment. The received noise signal and ambient noise in the environment of the receiving equipment reduce the intelligibility of the transmitted speech reproduced by the mobile phone. Furthermore, the levels of aforementioned noise signals and the level of the speech signal may vary, which makes it even more difficult to follow the reproduced speech.

A signal received by a mobile phone typically has a large dynamic range, ie. the difference between the highest and lowest signal level during a certain period of time is great. When the dynamic range of the received signal is large, it is hard to discern speech reproduced at the lowest signal levels from the noise signal and background noise, and at the highest signal levels the speech becomes disturbingly loud. In addition, at high signal levels the speech signal may be distorted in the receiver circuits, especially in the output amplifier and loudspeaker.

It is known several methods to attenuate interference and noise. U.S. Pat. No. 5,241,689 discloses a mobile telephone system in which audio signals from various sources arriving in a base station are converted to a predetermined amplitude level before the signal is sent to the radio channel. The intention of this arrangement is to make maximal use of the radio channel dynamic range and it does not essentially solve the other problems mentioned above.

It is known from patent documents EP 113615 and EP 514813 to compress the signal to be transmitted, or to narrow down the dynamic range of the signal to be transmitted before transmission and to expand it at reception with a corresponding reverse function. The compression algorithm parameter information is sent by means of a separate signal. The intention of this solution is to reduce the effect of noise accumulated in the signal transmitted on the transmission path especially in the uplink direction, ie. when transmitting a signal from a mobile phone to a fixed communication network. However, the method does not solve the other problems mentioned above.

From patent document EP 0 600 164 it is known a method wherein the compression parameters of a compression performed to a signal are adjusted in response to the noise level and the level of the signal from the microphone. The intention of the arrangement is to attenuate exceptionally strong microphone signals before transmission. This method improves the quality of the signal transmitted by a mobile phone but it cannot improve the reproduction quality of the signal received by a mobile phone.

U.S. Pat. No. 5,070,527 describes a method in which the level of a speech signal received from a transmission channel is compressed between two predetermined extremes. The system is intended to be used in conjunction with a headset in telephone exchanges to limit the reproduced speech signal below a maximum level determined by health authorities. The system uses for compression a feedback in which a peak value is defined for the speech signal, the defined value is compared to a predetermined limit value and the input signal amplification is controlled such that the resulting signal stays between the set limit values. In addition, the system includes a time constant according to which a signal at its upper limit value is reduced to the lower limit value. When the system uses peak value measurement instead of power measurement, the output signal level is limited below a predetermined value in all situations. This arrangement makes it easier to follow a received signal in a noisy environment and prevents the reproduction of signal levels too high. However, the arrangement does not solve problems caused by noise included in a received or transmitted signal.

U.S. Pat. No. 5,208,866 discloses an arrangement relating to a car stereo equipment, wherein the sound volume of the receiver is automatically adjusted in response to the ambient noise level. If this solution were applied in a mobile communication system, it would have the disadvantage that if the level of noise included in the received signal were high, the speech reproduced by a mobile station would in any case be masked by noise included in the received signal and by ambient noise.

Thus, none of the prior art methods mentioned above can solve all aforementioned problems related to the reproduction of an audio signal. Furthermore, combining said prior art solutions would result in a complex implementation which would result in a significant increase in the manufacturing costs when applied to mobile phones, for example.

OBJECT OF THE INVENTION

The object of the present invention is to provide a method and a circuit arrangement with which aforementioned problems can be solved and which can produce better quality audio signal reproduction than known solutions.

SUMMARY OF THE INVENTION

An essential idea behind the invention is that the level and noise level of the received signal as well as the ambient noise in the receiver's environment are measured and the level and the dynamic range of the reproduced signal are adjusted according to the measurement results. Advantageously, frequency weighting is used in said measurements. Thereby, the intelligibility of the reproduced signal is improved in varying environmental conditions.

The method according to the invention is characterized by the characterizing part of claim 1 or 18. The circuit arrangement according to the invention is characterized by the characterizing part of claim 20 or 25. Advantageous embodiments of the invention are disclosed in the sub-claims.

BRIEF DESCRIPTION OF THE DRAWINGS

The invention is described by means of the accompanying drawings, wherein.

DETAILED DESCRIPTION OF THE PREFERRED EMBODIMENTS(S)

Below, we will first describe the operating principle of the method according to the invention by means of FIGS. 1 and 2, and then we will disclose in more detail a solution according to the invention by means of FIGS. 3, 4 and 5.

Figure 1:
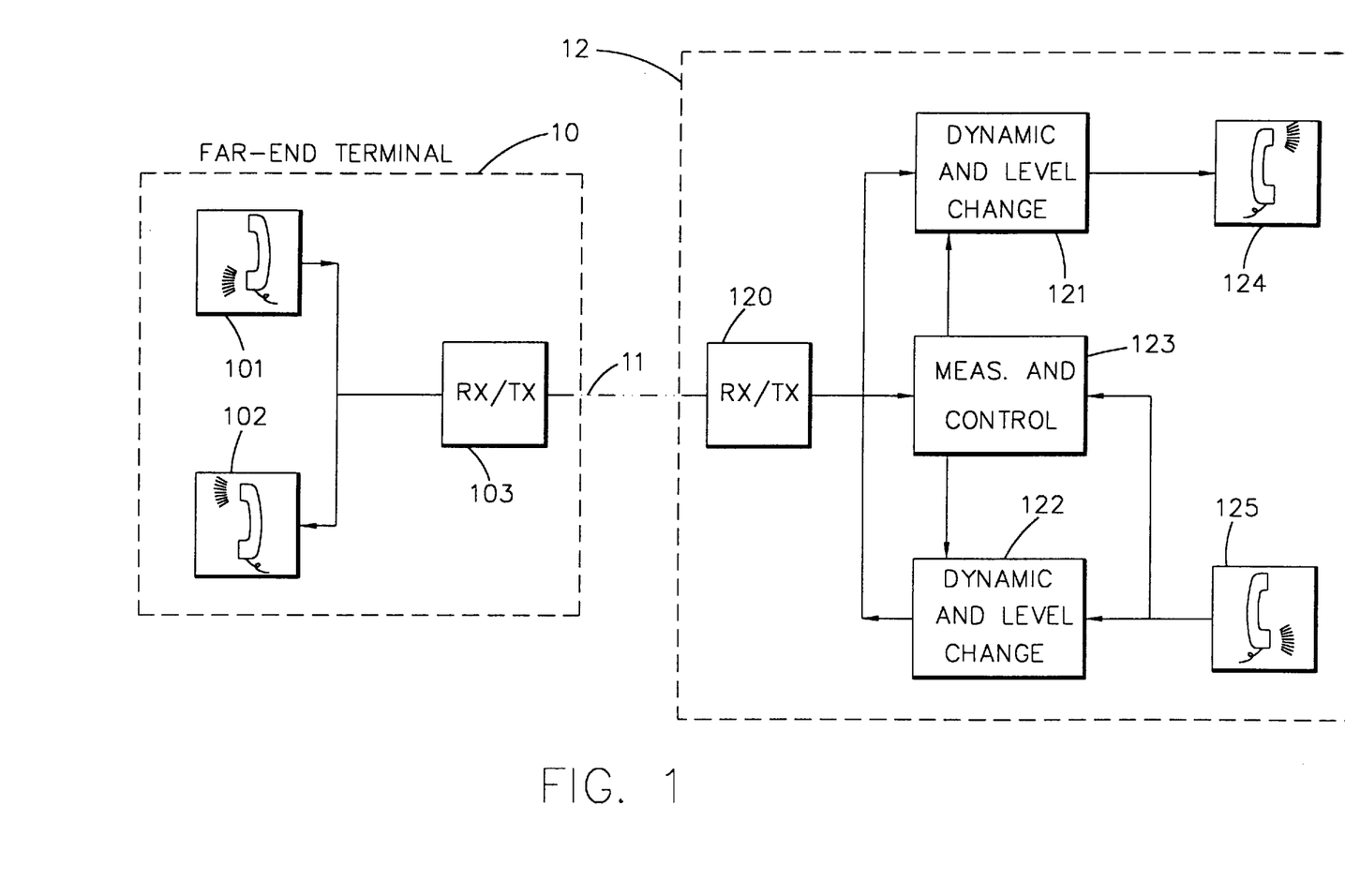
FIG. 1 shows in block diagram format the principle of a solution according to the invention.

FIG. 1 is a block diagram illustrating the principle of an arrangement according to the invention in a communication system. In addition to a mobile phone 12 serving as a near-end terminal the figure shows a far-end terminal 10 and a transmission channel 11. A near-end terminal means the terminal described here and a far-end terminal means any terminal to which the near-end terminal is connected via a transmission channel.

The far-end terminal 10 picks up at the far-end an audio signal 101, such as a speech signal, and converts it to a form 103 transmitted on the transmission channel 11 by modulating, for example, a radio-frequency carrier with the audio signal. The mobile phone receives the signal from the transmission channel and detects the transmitted audio signal 120. The dynamic range and the level of the received audio signal are converted 121 according to the invention and the converted signal is reproduced 124.

In the reverse transmission direction the near-end terminal 12 picks up an audio signal 125 to be transmitted, the dynamic range and level of which are converted 122 according to the invention. The signal is further converted to a form transmitted on the transmission channel and sent 120 to the transmission channel 11. The signal transmitted on the transmission channel is received at the far-end terminal 10 and the transmitted audio signal is detected 103 from the received signal and said audio signal is then reproduced 102.

The received and transmitted signal dynamic range and level conversions 121, 122 according to the invention are controlled according to the results from the received and transmitted signal measurements 123.

Figure 2:
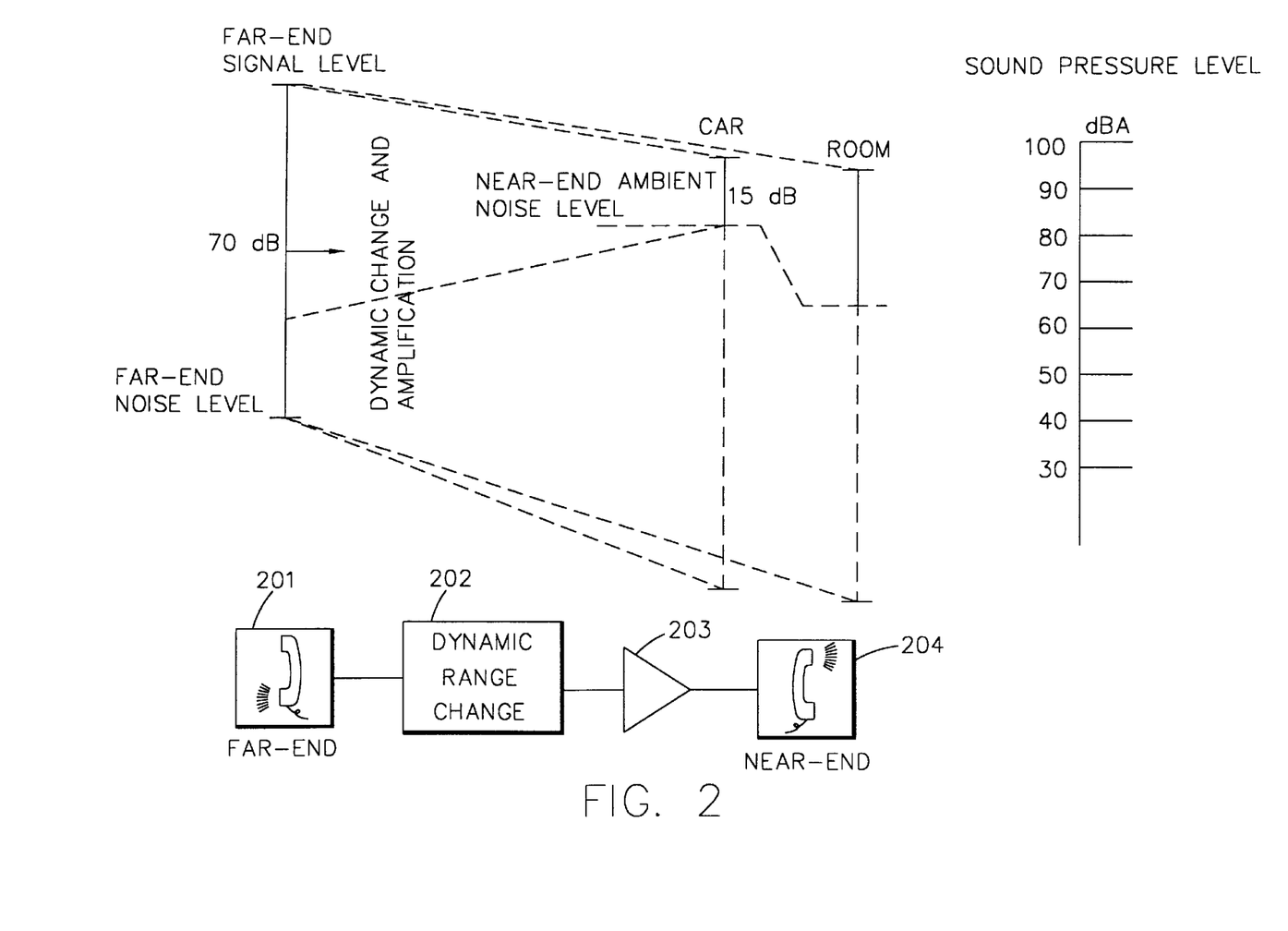
FIG. 2 shows audio signal level and dynamic range values in the far-end and in two near-end environments in a solution according to the invention.

FIG. 2 shows an example of signal level conversions according to the invention. The payload signal, say a speech signal, in the signal received from the far-end 201 has a dynamic range of 70 dB, and the level of noise is 20 dB. According to the invention, the ambient noise level and the level and noise level of the signal sent by the far-end are measured and the dynamic range of the reproduced payload signal is adjusted 202 according to the measurement results. Then the signal is amplified 203 for reproduction in the receiver 204.

If the receiver is in a car, the ambient noise level is relatively high, whereby the dynamic range of the payload signal is reduced to 15 dB in our example. Correspondingly, when the receiver is located in a less noisy environment, such as a quiet room, the dynamic range of the payload signal is 30 dB in the example. In spite of the compression of the dynamic range of the payload signal the overall dynamic range can remain unchanged (90 dB), as in the example illustrated in FIG. 2, since low-level signals, which contain mainly noise, are attenuated. As these lowest-level received signals are mainly noise signals, the average signal-to-noise ratio of the reproduced signal can be improved by attenuating the lowest signal levels, thereby enhancing the intelligibility of the reproduced speech. This is a reverse operation as compared to the generally used method in which noise is added to the signal reproduced during pauses in the speech.

The conversion described above need not result in a significant change in the overall dynamic range of the reproduced signal, but signals that mainly contain noise are attenuated, and signals that contain payload signal in excess of a certain limit value are confined to a narrow dynamic range the level of which substantially exceeds the ambient noise level.

FIG. 2 shows the average sound pressure levels used in the example. In the solution according to the invention, however, the dynamic range and level of the signal can be advantageously adjusted with respect to the operation of the sense of hearing, on the basis of perceived loudness, not linearly on the basis of the measured sound pressure. In addition to the sound pressure, several factors affect the perceived loudness; frequency distribution is the most significant one of them. The perceived loudness of the signal can be taken into account by using, in the sound pressure and audio signal level and noise level measurements, a filter with a weighting function that has an effect reverse to the response of the sense of hearing. Then the simplest option is to use a standard weighting function the frequency response of which is reverse to that of the sense of hearing. Thus, the level and dynamic range of the reproduced signal can be made dependent on the frequency content of the signal and ambient noise.

The solution illustrated in FIG. 2 improves the intelligibility of an audio signal received by a near-end terminal, such as a mobile phone. A corresponding solution may also be used for processing a signal transmitted from a near-end terminal in order to achieve better intelligibility at the receiving end. Then the dynamic range and level conversion function for the signal to be transmitted can be the same as in the conversion for a received signal or it may be different. If then the conversion according to the invention is used both at the near-end and at the far-end terminal, the conversion for the transmitted signal is performed at both terminals. One alternative is to perform the conversion at the sending terminal only according to the signal level and noise level of the transmitted signal, and at the receiving terminal only according to the ambient noise level in the space surrounding the terminal. Then one and the same conversion will not be performed twice for the signal.

Figure 3:
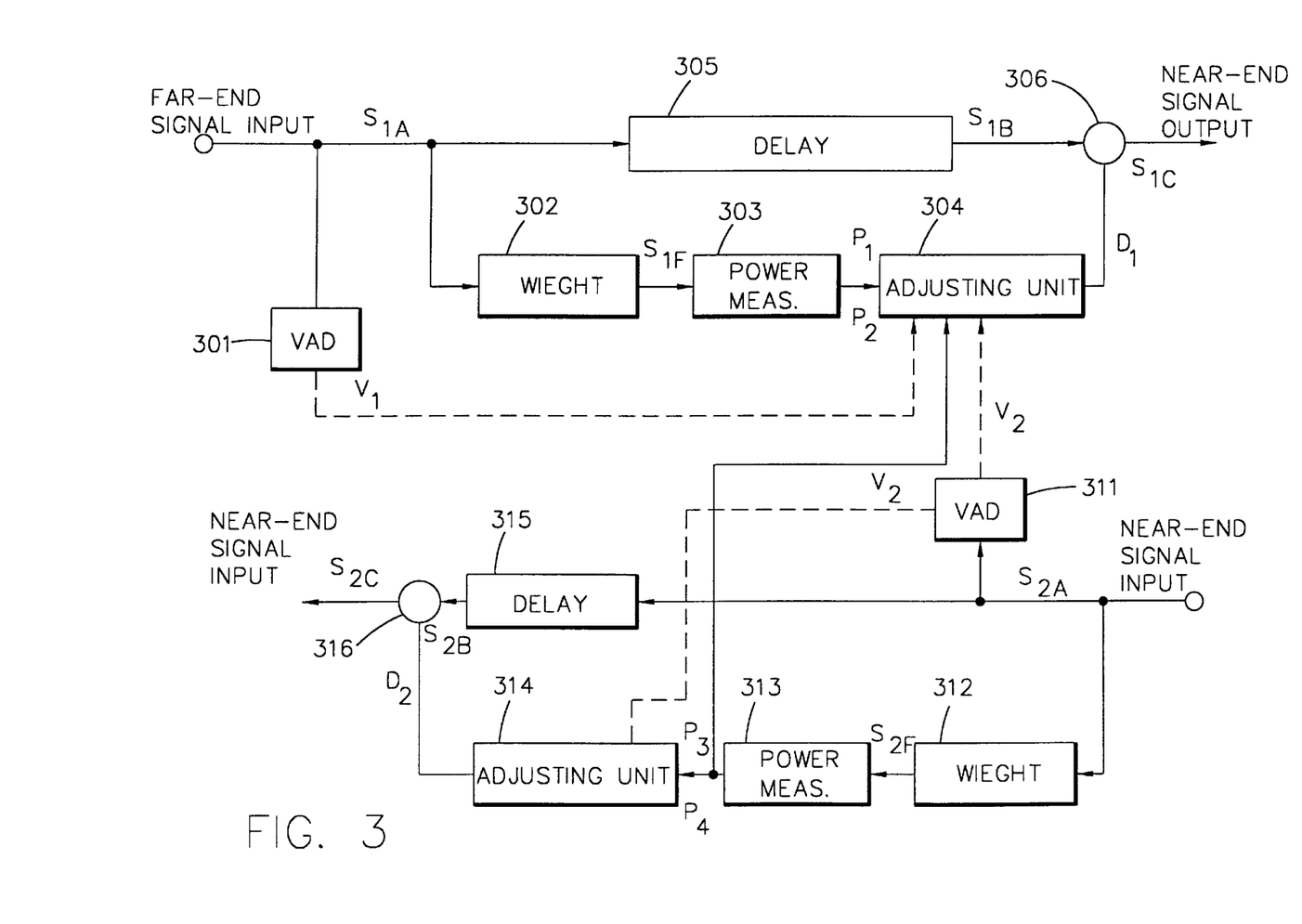
FIG. 3 shows in block diagram format an implementation of a solution according to the invention.
Figure 4:
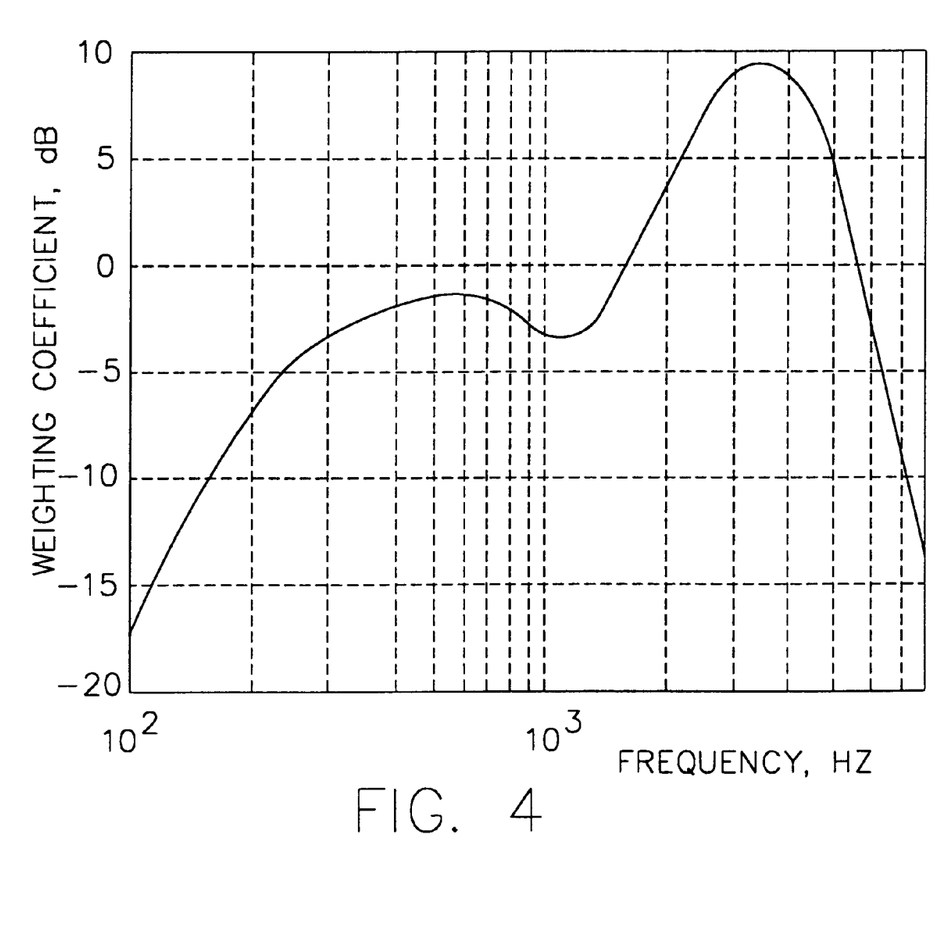
FIG. 4 shows an F-filter weighting function used in a solution according to the invention.

FIG. 3 shows a block diagram of a solution in which a signal conversion is performed both for the transmitted and the received signal. Prior to power measurement, a frequency weighting with a weighting filter 302 is performed for the digital signal $s_{1a}$ received from the far-end to achieve even loudness perception at various frequencies. The weighting filter can be a known A, B, C or F filter, for example. FIG. 4 shows the weighting coefficient of an F filter as a function of frequency.

Frequency-weighted signal $s_{1f}$ is taken to a power measuring unit 303 (FIG. 3) in which power $p_1$, $p_2$ is measured using e.g. running average calculation or other known method. The received signal level $p_1$ is measured continuously and the noise level $p_2$ is measured at silent moments, ie. when the signal contains no speech. Detection of such silent moments is performed with a known voice activity detector (VAD) unit 301. The output signal $v_1$ of the VAD unit has two states depending on whether the input signal measured by the VAD unit is substantially speech or noise/ interference. When the output signal $v_1$ of the VAD unit indicates to the adjusting unit 304 that the input signal is noise/interference, the adjusting unit stores the power value $p_2$ in memory and uses the value as the received signal noise level value in the adjustment of the dynamic range and level of the signal. Similarly, power value $p_1$ is used as the received signal level value in the adjustment of the dynamic range and level of the signal.

A corresponding noise level power measurement is performed for the signal $s_{2a}$ picked up at the near-end, using the weighting unit 312, power measuring unit 313 and VAD unit 311, thereby producing measurement result $p_3$. The near-end ambient background noise power $p_3$ is measured when no speech appears in the signal. When the frequency-weighted level $p_1$ and noise level $p_2$ of the received signal and the near-end frequency-weighted background noise $p_3$ have been measured, the adjusting unit 304 chooses dynamic range and level adjusting parameters that suite these values.

Correctly timed adjustment of the dynamic range and level of signal $s_{2a}$ can be performed by delaying signal $s_{2a}$ in a delay unit 305 and multiplying, in a multiplier 306, the delayed signal $s_{1b}$ by value $d_1$ determined by the adjusting unit. The multiplier 306 produces output signal $s_{1c}$ the dynamic range and level of which have been adjusted. The length of the delay generated by the delay unit 305 is advantageously set to equal the sum of the times that it takes to perform the weighting, power measurement and control value calculation. The delay unit 305 can be realized by means of a shift register, for example.

In the dynamic range and level adjustment, it is advantageous to apply a predetermined time constant according to which the control values are changed. According to tests, a suitable conversion time constant value is 1 to 100 ms.

As mentioned above, the dynamic range and level conversion controlled by the adjusting unit is determined on the basis of background noise, received signal content and possible other environmental conditions. The value can be fetched from a parameter table, for example, which stores dynamic range and level values suitable for various conditions. According to these dynamic range and level values the adjusting unit then determines the control value $d_1$ sent to the multiplier 306. The adjusting unit 304 can be realized with a processor and a memory, for example, whereby the memory permanently stores the parameter table mentioned above and temporarily the obtained noise and ambient noise level measurement values.

In addition to the noise level measured for the near-end environment, other environmental conditions can be taken into account by storing several parameter tables in the adjusting unit's memory. A parameter describing the environment is then input in the adjusting unit, whereby the adjusting unit will use the parameter table associated with that environment parameter. The environment parameter may depend e.g. on the acoustic characteristics of the space surrounding the receiver or on the characteristics of external devices, such as loudspeakers, belonging to the receiver equipment.

Correspondingly, the conversion of the signal to be transmitted is performed in our example using a delay unit 315, weighting unit 312, power measuring unit 313, adjusting unit 314 and a VAD unit 311. Frequency weighting 312 is performed for the near-end signal $s_{2a}$, whereafter the power of the frequency-weighted signal $s_{2f}$ is measured in the power measuring unit 313. Signal $v_2$ from the VAD unit 311 indicates whether the near-end signal $s_{2a}$ is speech or noise.

During noise the adjusting unit stores the measurement result from the power measuring unit 313 as the noise power value $p_3$. In addition, the adjusting unit monitors the continuous power level $p_4$ of the near-end signal. The adjusting unit 314 determines a control value $d_2$ on the basis of the measured noise $p_3$ and continuous signal power $p_4$ measured at the near-end and signal $v_2$ from the VAD unit 311. Voice activity detection $v_1$ for the signal $s_{1a}$ received from the far-end is not utilized in the adjustment of the transmitted signal in this example.

In the case described above the audio signal processed is a digital one, whereby signal processing in each unit is also digital. Naturally, the solution according to the invention can be realized using analog signals as well.

To achieve frequency weighting it is also possible to use frequency-level processing, such as a fast Fourier transform (FFT) function, or signal processing by frequency bands. Then it is advantageous to perform processing associated with all said units in the frequency domain. This implementation is advantageous when frequency-level processing is also used for other functions of the equipment, whereby the application of the method according to the invention will not significantly increase the manufacturing costs of the equipment.

Figure 5:
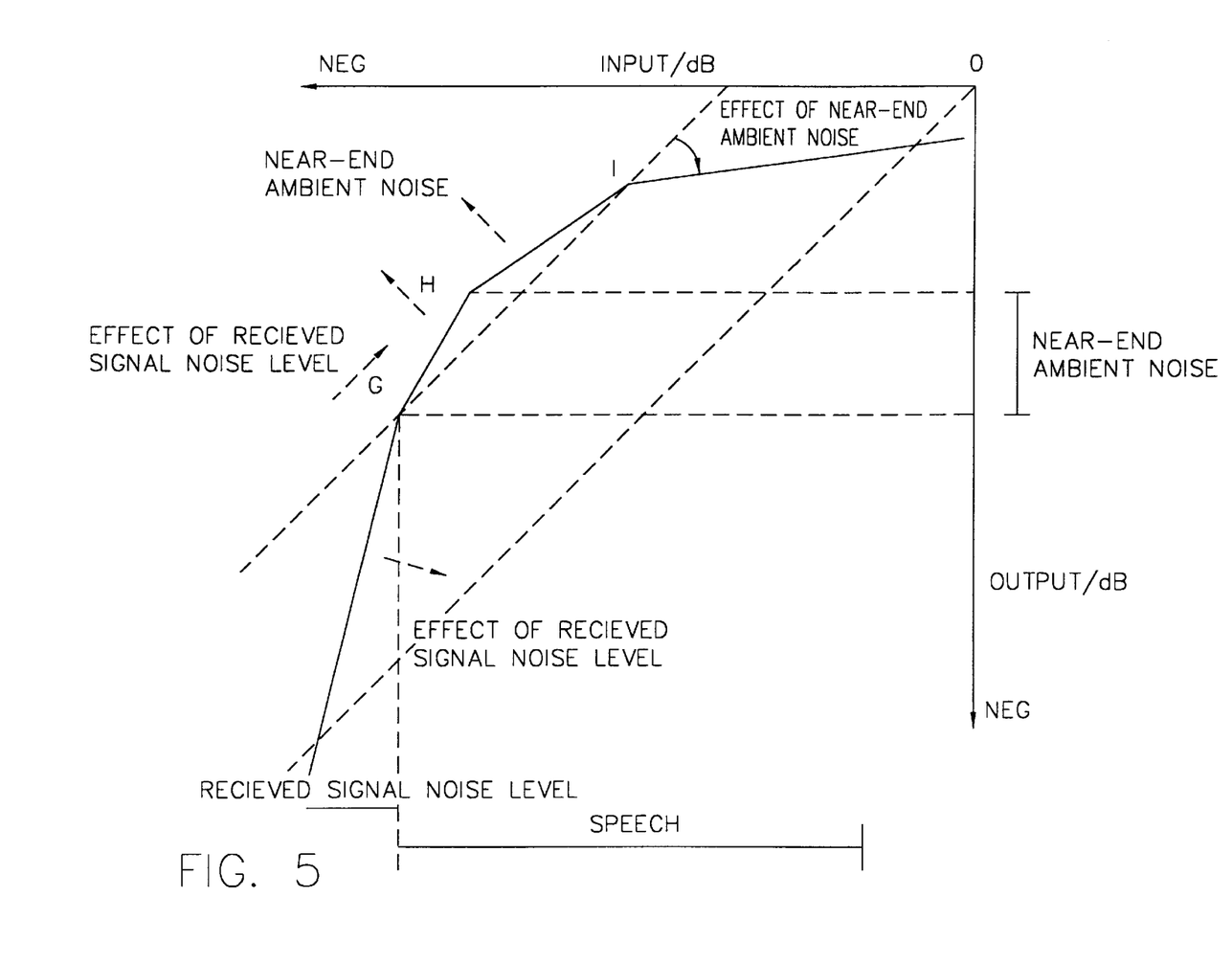
FIG. 5 shows the audio signal conversion function used in a solution according to the invention and the effect of the noise and ambient noise level on the conversion function.

FIG. 5 shows an audio signal conversion function according to the invention. The gain at the lowest signal levels is low because such signals mainly contain noise. As the signal levels are raised, the gain increases until the signal level reaches the received signal average noise level, at point g. At this signal level the signal also contains information, so the gain is high. After that, as the signal level is raised, the gain increases more slowly until the reproduced signal level is the sum of the reproduced noise level and ambient noise, point h, whereby the gain advantageously is at the highest. At this signal level it would be difficult to discern information from ambient noise without amplification, but with amplification the ratio of the payload signal to the ambient noise level is improved and, thereby, the intelligibility of reproduced speech is also improved. As the signal level goes further up, the gain decreases slowly until the reproduced signal level exceeds by a predetermined margin the sum of the reproduced noise signal and ambient noise level, point i, whereby reproduced information is easily discernible from noise and ambient noise. At this point, the gain is advantageously as high as at point g mentioned above. To prevent the highest signal levels from becoming too loud, the amplification is decreased more quickly at the highest signal levels after point i.

In FIG. 5, arrows indicate the effect of the noise level of the received signal and the ambient noise level on the conversion function. As the noise or ambient noise level is raised, the conversion function curve moves to the direction of the appropriate arrow. As noise in the received signal increases, the gain of the lower signal levels decreases. Then point g in the curve moves along the constant gain line (indicated by a dashed line) until point g is at the noise level. At lower signal levels, the gain curve moves with point g, retaining its slope. As the near-end ambient noise level is raised, the gain increases to compensate for the ambient noise. Then the g-h-i part of the gain curve moves to the higher gain area and at signal levels higher than point i, the slope of the gain curve decreases such that the curve ends at the same maximum output level independent of the noise level. This is to avoid distortion of reproduction at the loudest levels.

The solution according to the invention can solve all aforementioned problems related to the prior art without significantly increasing the manufacturing costs of the products. The solution according to the invention can be implemented with a simple circuit arrangement since level adjustment can be performed for the whole frequency band. Therefore, no filters are needed to divide the signal in frequency bands, nor multiple level adjusting units.

By means of the level conversion performed for the received signal the effect of the receiver ambient noise and received noise signal is made smaller. In addition, the distortion produced in the receiver output amplifier and loudspeaker is decreased. Because of the frequency weighting, changes in the received signal frequency distribution do not adversely affect the intelligibility of received information.

Above it has been discussed applications of the method according to the invention. Naturally, the principle according to the invention can be modified within the scope of the invention, e.g. as regards implementation details and fields of use.

While in the examples discussed above the signal adjustment is directed to both the dynamic range and the level of the signal, the solution according to the invention can be applied solely to dynamic range adjustment or solely to signal level adjustment. In the examples described above, the information in the transmitted audio signal was speech, but naturally the method can also be applied to other information, such as music, for example, transmitted in the form of an audio signal.

In a mobile communication system, the solution according to the invention can be applied in the uplink or downlink transmission direction or in both directions.

What is claimed is:

1. A method for adjusting the level and/or dynamic range of a first audio signal ($s_{1a}$) containing noise and information for reproduction in a space containing acoustic noise, comprising the steps of:
    measuring the level of said first audio signal to obtain a first measured value ($p_1$),
    measuring the noise level of said first audio signal to obtain a second measured value ($p_2$),
    measuring the acoustic noise level of said space to attain a third measured value ($p_3$), and
    adjusting the level and/or dynamic range of said first audio signal in accordance with said first, second, and third measured values ($p_1,p_2,p_3$).

2. The method of claim 1, wherein said noise level measurement for the first audio signal ($s_{1a}$) is performed at moments when the first audio signal does not contain information.

3. The method of claim 1, wherein prior to the noise level measurement for the first audio signal ($s_{1a}$) the first audio signal is filtered according to the frequency distribution of the signal.

4. The method of claim 1, wherein prior to the acoustic noise level measurement the sound pressure is converted to a second audio signal ($s_{2a}$) which is measured to obtain said third measured value ($p_3$).

5. The method of claim 4, wherein said measurement for the second audio signal ($s_{2a}$) is performed at moments when the second audio signal does not contain information.

6. The method of claim 4, wherein prior to said measurement for the second audio signal ($s_{2a}$), the second audio signal is filtered according to the frequency distribution of the second audio signal.

7. The method of claim 1, wherein to adjust the dynamic range and/or level of said first audio signal ($s_{2a}$) the first audio signal is multiplied by a control value ($d_1$) which depends on said first, second and third measured values ($p_1,p_2,p_3$).

8. The method of claim 7, wherein, prior to the multiplication of the first audio signal ($p_{1a}$), the first audio signal is delayed by a delay the length of which substantially equals the time consumed in the calculation of the control value ($d_1$).

9. The method of claim 1, wherein the first audio signal ($s_{1a}$) is transmitted in a transmission system between a first terminal (10) and a second terminal (12), said second terminal being located in said space.

10. The method of claim 9, wherein the first audio signal ($s_{1a}$) is transmitted from the first terminal (10) to the second terminal (12) and the second audio signal ($s_{2a}$) is transmitted from the second terminal to the first terminal, and
    the level of said first audio signal is measured to obtain a first measured value ($p_1$),
    the noise level of said first audio signal is measured to obtain a second measured value ($p_2$),
    the acoustic noise level of said space is measured to obtain a third measured value ($p_3$), and
    the level and/or dynamic range of said first audio signal are adjusted according to said first, second, and third measured values ($p_1,p_2,p_3$).

11. The method of claim 10, wherein the level and noise level measurement for said first audio signal ($s_{1a}$), the acoustic noise level measurement for said space from the second audio signal ($s_{2a}$), and the level and/or dynamic range adjustment for said first audio signal are performed in said second terminal (12).

12. The method of claim 10, wherein
    the level of said first audio signal ($s_{1a}$) is measured at the first terminal (10) to obtain a first measured value ($p_1$),
    the noise level of said first audio signal is measured at said first terminal to obtain a second measured value ($p_2$),
    the level and/or dynamic range of said first audio signal are adjusted according to said first and second measured values ($p_1,p_2$) ,
    the acoustic noise level of said space is measured from the second audio signal ($s_{2a}$) at said second terminal (12) to obtain a third measured value ($p_3$), and
    the level and/or dynamic range of said first audio signal ($s_{1a}$) are adjusted according to said third measured value ($p_3$).

13. The method of claim 9, wherein the continuous power level of said second audio signal ($s_{2a}$) is measured to obtain a fourth measured value ($p_4$) and the level and/or dynamic range of said second audio signal ($s_{2a}$) are adjusted according to said third measured value ($p_3$) and fourth measured value ($p_4$) and the adjusted audio signal ($s_{2a}$) is transmitted from said second terminal (12) to said first terminal (10).

14. The method of claim 1, wherein a predetermined conversion time constant is used in the dynamic range and/or level adjustment.

15. The method of claim 14, wherein said conversion time constant is 1 to 100 ms.

16. The method of claim 1, wherein said first audio signal is transmitted in a mobile communication system on a downlink transmission path from a base station to a mobile station.

17. The method of claim 1, wherein said first audio signal is transmitted in a mobile communication system on an uplink transmission path from a mobile station to a base station.

18. A method for adjusting the dynamic range and/or level of a second audio signal ($s_{2a}$) picked up from a space, comprising the steps of:

measuring the acoustic noise level of said space from said second audio signal ($s_{2a}$) to obtain said third measured value ($p_3$), measuring the continuous power level of said second audio signal ($s_{2a}$) to obtain a fourth measured value ($p_4$), adjusting the level and/or dynamic range of said second audio signal ($s_{2a}$) in accordance with said third measured value ($p_3$) and fourth measured value ($p_4$).

19. The method of claim 18, wherein said second audio signal ($s_{2a}$) is transmitted after the dynamic range and/or level adjustment to a transmission channel (11) in a transmission system.

20. A circuit arrangement for adjusting the level and/or dynamic range of a first audio signal ($s_{1a}$) reproduced in a space, comprising:

means (303) for measuring the level of the first audio signal ($s_{1a}$) to obtain a first measured value ($p_1$), means (303) for measuring the noise level in the first audio signal ($s_{1a}$) to obtain a second measured value ($p_2$), means (313) for measuring the noise level in said space to obtain a third measured value ($p_3$), and means (304, 306) for adjusting the level and/or dynamic range of the first audio signal ($s_{1a}$) in accordance with said first, second and third measured values ($p_1,p_2,p_3$).

21. The circuit arrangement of claim 20, further comprising a weighting filter (302,312), disposed prior to the signal power measuring means (303, 313), having an output signal ($s_{1f}$) level which depends on the frequency of the input signal ($s_{1a}$) in order to make the power measurement value ($p_1,p_2,p_3$) dependent on the signal frequency distribution.

22. The circuit arrangement of claim 21, wherein said weighting filter (302,312) is one of an A-, B-, C- and P-type filter.

23. The circuit arrangement of claim 20, further comprising means for picking up a second audio signal ($s_{2a}$) from said space, means (312,313) for measuring the ambient noise level of the space from said second audio signal to obtain said third measured value ($p_3$), and means (314,316) for adjusting the level and/or dynamic range of the second audio signal ($s_{2a}$) in accordance with said third measured value ($p_3$) and fourth measured value ($p_4$).

24. The circuit arrangement of claim 20, further comprising means (305,315) tor delaying one of the first audio signal ($s_{1a}$) and the second audio signal ($s_{2a}$) prior to the level and/or dynamic range adjustment.

25. A circuit arrangement for adjusting the level and/or dynamic range of a second audio signal ($s_{2a}$) picked up from a space, comprising means (312,313) tor measuring the ambient noise level of said space from said second audio signal to obtain said third measured value ($p_3$), means (312,313) for measuring the level of said second audio signal and to obtain a fourth measured value ($p_4$), and means (122, 314, 316) for adjusting the level and/or dynamic range of the second audio signal ($s_{2a}$) in accordance with said third measured value ($p_3$) and fourth measured value ($p_4$).

26. The circuit arrangement of claim 25, further comprising means (120) for transmitting said second audio signal ($s_{2a}$) to a transmission channel (11) in a transmission system after said dynamic range and/or level adjusting means (122).

27. A method for adjusting the level and/or dynamic range of a first audio signal ($s_{1a}$) containing noise and information for reproduction in a space containing acoustic noise, comprising the steps of:

measuring the level of said first audio signal to obtain a first measured value ($p_1$), measuring the noise level of said first audio signal to obtain a second measured value ($p_2$), measuring the acoustic noise level of said space to obtain a third measured value ($p_3$), and adjusting the level and/or dynamic range of said first audio signal in accordance with said first, second and third measured values ($p_1$, $p_2$, $p_3$) by expanding the signal, when the signal level value is below a first threshold value (g), compressing the signal, when the signal level value is above a second threshold value (i), and processing the signal in a substantially linear manner, when the signal level value is between said first and second threshold values (g,i).

28. A method according to claim 27, wherein the threshold values are determined on the basis of the measured values.

29. A method for adjusting the dynamic range and/or level of a second audio signal ($s_{2a}$) picked up from a space, comprising the steps of:

measuring the acoustic noise level of said space from said second audio signal ($s_{2a}$) to obtain said third measured value ($p_3$), measuring the continuous power level of said second audio signal ($s_{2a}$) to obtain a fourth measured value ($p_4$), adjusting the level and/or dynamic range of said second audio signal ($s_{2a}$) according to said third measured value ($p_3$) and fourth measured value ($p_4$) by expanding the signal, when the signal level value is below a first threshold value (g), compressing the signal, when the signal level value is above a second threshold value (i), and processing the signal in a substantially linear manner, when the signal level value is between said two threshold values (g,i).

30. A method according to claim 28, wherein the threshold values are determined on the basis of the measured values.

31. A circuit arrangement for adjusting the level and/or dynamic range of a first audio signal ($s_{1a}$) reproduced in a space, comprising:

means (303) to measure the level of the first audio signal ($s_{1a}$) to obtain a first measured value ($p_1$), means (303) to measure the noise level in the first audio signal ($s_{1a}$) to obtain a second measured value ($p_2$), means (313) to measure the noise level in said space to obtain a third measured value ($p_3$), and means (304, 306) to adjust the level and/or dynamic range of the first audio signal ($s_{1a}$) according to said first, second and third measured values ($p_1,p_2,p_3$) comprising:

means for expanding the signal, when the signal level value is below a first threshold value (g), means for compressing the signal, when the signal level value is above a second threshold value (i), and means for processing the signal in a substantially linear manner, when the signal level value is between said two threshold values (g,i).

32. A circuit arrangement according to claim 31, wherein the threshold values are determined on the basis of the measured values.

33. A circuit arrangement for adjusting the level and/or dynamic range of a second audio signal ($s_{2a}$) picked up from a space, comprising:

means (312,313) to measure the ambient noise level of said space from said second audio signal to obtain said third measured value ($p_3$), means (312,313) to measure the level of said second audio signal and to obtain a fourth measured value ($p_4$), and means (122,314,316) to adjust the level and/or dynamic range of the second audio signal ($s_{2a}$) according to said third measured value ($p_3$) and fourth measured value ($p_4$) comprising:

means for expanding the signal, when the signal level value is below a first threshold value (g), means for compressing the signal, when the signal level value is above a second threshold value (i), and means for processing the signal in a substantially linear manner, when the signal level value is between said two threshold values (g,i).

34. A circuit arrangement according to claim 33, wherein the threshold values are determined on the basis of the measured values.

* * * * *

UNITED STATES PATENT AND TRADEMARK OFFICE
CERTIFICATE OF CORRECTION

PATENT NO. : 5,907,823
DATED : May 25, 1999
INVENTOR(S) : Sjoberg et al.

It is certified that error appears in the above-identified patent and that said Letters Patent is hereby corrected as shown below:

In Claim 7, col. 7, line 66, "$(s_{2a})$" should read --$(s_{1a})$--.

In Claim 22, col. 9, line 35, "P-type" should read --F-type--.

In Claim 24, col. 9, line 49, "tor delaying" should read --for delaying--.

In Claim 25, col. 9, line 55, "tor measuring" should read --for measuring--.

Signed and Sealed this

Sixteenth Day of November, 1999

Attest:

Q. TODD DICKINSON

*Attesting Officer*  *Acting Commissioner of Patents and Trademarks*